United States Patent
An et al.

(10) Patent No.: US 12,334,185 B2
(45) Date of Patent: Jun. 17, 2025

(54) MEMORY SYSTEMS AND DEVICES THAT SUPPORT METHODS FOR CALIBRATING INPUT OFFSETS THEREIN

(71) Applicant: Samsung Electronics Co., Ltd., Suwon-si (KR)

(72) Inventors: YongHyun An, Suwon-si (KR); Hae Young Chung, Suwon-si (KR); Soyeong Shin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 108 days.

(21) Appl. No.: 18/465,416

(22) Filed: Sep. 12, 2023

(65) Prior Publication Data

US 2024/0296876 A1    Sep. 5, 2024

(30) Foreign Application Priority Data

Mar. 3, 2023    (KR) .......................... 10-2023-0028238

(51) Int. Cl.
*G11C 7/10* (2006.01)
*G11C 7/14* (2006.01)

(52) U.S. Cl.
CPC .......... *G11C 7/1084* (2013.01); *G11C 7/1012* (2013.01); *G11C 7/14* (2013.01); *G11C 2207/2254* (2013.01)

(58) Field of Classification Search
CPC ....... G11C 7/1084; G11C 7/1012; G11C 7/14; G11C 2207/2254; G11C 7/1057; G11C 29/022; G11C 19/28; G11C 29/024; G11C 11/4091; G11C 7/065; G11C 7/1045; G11C 11/4093
See application file for complete search history.

(56) References Cited

U.S. PATENT DOCUMENTS

| | | | |
|---|---|---|---|
| 6,674,322 B2 | 1/2004 | Motz | |
| 7,023,266 B2 | 4/2006 | Chung | |
| 7,514,978 B2 | 4/2009 | Smelloy et al. | |
| 9,087,567 B2 | 7/2015 | Yildirim et al. | |
| 9,577,619 B2 | 2/2017 | Kim et al. | |
| 10,325,659 B1 | 6/2019 | Tang et al. | |
| 11,322,194 B2 | 5/2022 | Someya et al. | |
| 11,410,730 B2 | 8/2022 | Tang et al. | |
| 2019/0259429 A1* | 8/2019 | Heo | G11C 29/028 |

FOREIGN PATENT DOCUMENTS

KR    100564606 B1    3/2006

* cited by examiner

*Primary Examiner* — Xiaochun L Chen
(74) *Attorney, Agent, or Firm* — Myers Bigel, P.A.

(57) ABSTRACT

A memory device includes a memory cell array and an input/output circuit. The input/output circuit is configured to: (i) generate second data in response to sampling first data by comparing the first data against a reference voltage, (ii) generate an offset calibration code corresponding to a first input offset of the input/output circuit based on the second data, prior to receiving a mode register code, (iii) change a gain of an input buffer corresponding to the mode register code after receiving the mode register code, and (iv) calibrate a second input offset corresponding to the changed gain of the input buffer by adjusting a current amount applied to a current element electrically connected to an input terminal of the input buffer based on the offset calibration code and the mode register code. Control logic may also be used to provide the mode register code, which includes gain information associated with the input/output circuit, to the input/output circuit.

20 Claims, 13 Drawing Sheets

FIG.4

| MRC | GIC | CALC | Need Amount for Code Shift |
|---|---|---|---|
| 011 | GI3(6dB) | 0101 | −2 |
| 010 | GI2(4dB) | 0110 | −1 |
| 001 | GI1(2dB) | 0111 | 0 |
| 000 | GI0(0dB) | 0111 | 0 |
| 101 | GI5(−2dB) | 1000 | +1 |
| 110 | GI6(−4dB) | 1001 | +2 |
| 111 | GI7(−6dB) | 1010 | +3 |

FIG.6

| CALC | TMC |
|------|-----|
| 0000 | 000 0000 0000 0000 |
| 0001 | 000 0000 0000 0001 |
| 0010 | 000 0000 0000 0011 |
| 0011 | 000 0000 0000 0111 |
| 0100 | 000 0000 0000 1111 |
| 0101 | 000 0000 0001 1111 |
| 0110 | 000 0000 0011 1111 |
| 0111 | 000 0000 0111 1111 |
| 1000 | 000 0000 1111 1111 |
| 1001 | 000 0001 1111 1111 |
| 1010 | 000 0011 1111 1111 |
| 1011 | 000 0111 1111 1111 |
| 1100 | 000 1111 1111 1111 |
| 1101 | 001 1111 1111 1111 |
| 1110 | 011 1111 1111 1111 |
| 1111 | 111 1111 1111 1111 |

FIG.9
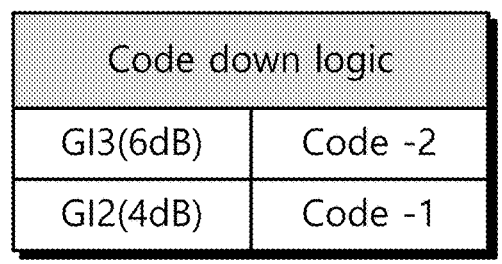
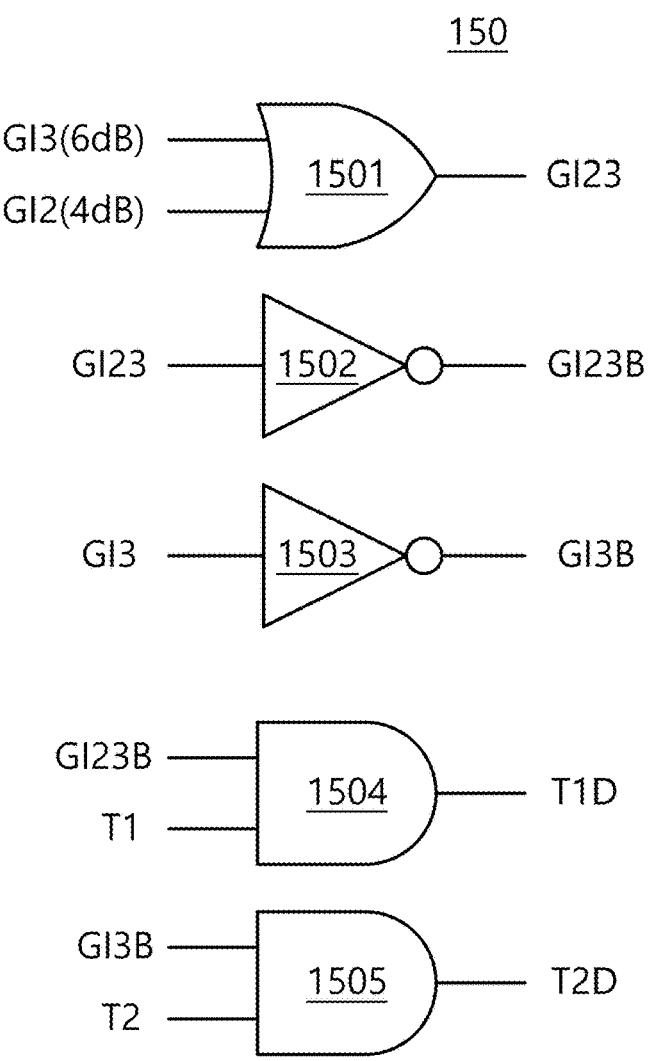

FIG.10
| Code up logic | |
|---|---|
| GI5(-2dB) | Code +1 |
| GI6(-4dB) | Code +2 |
| GI7(-6dB) | Code +3 |
150
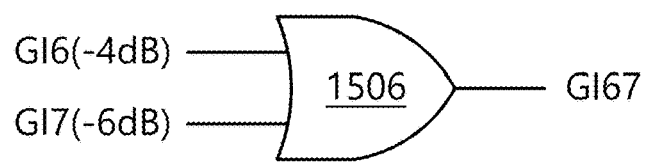
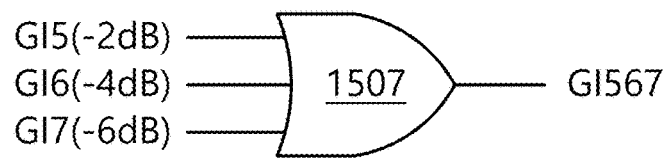
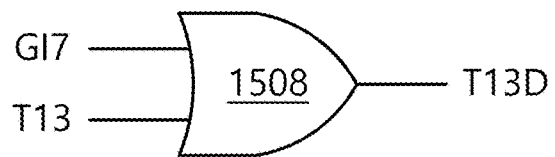
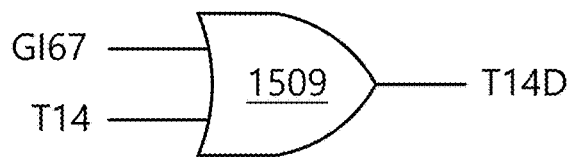
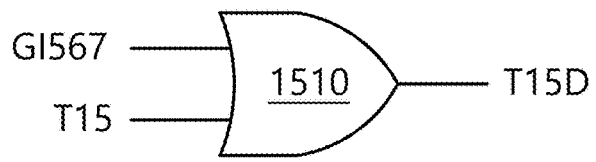

FIG.11

| GIC | Current Switch Signal | | | | | | | | | Code Shift |
|---|---|---|---|---|---|---|---|---|---|---|
| | T1D | T2D | T3D | T4D | ... | T12D | T13D | T14D | T15D | |
| GI3(6dB) | L | L | T3 | T4 | ... | T12 | T13 | T14 | T15 | −2 |
| GI2(4dB) | L | T2 | T3 | T4 | ... | T12 | T13 | T14 | T15 | −1 |
| GI1(2dB) | T1 | T2 | T3 | T4 | ... | T12 | T13 | T14 | T15 | 0 |
| GI0(0dB) | T1 | T2 | T3 | T4 | ... | T12 | T13 | T14 | T15 | 0 |
| GI5(−2dB) | T1 | T2 | T3 | T4 | ... | T12 | T13 | T14 | H | +1 |
| GI6(−4dB) | T1 | T2 | T3 | T4 | ... | T12 | T13 | H | H | +2 |
| GI7(−6dB) | T1 | T2 | T3 | T4 | ... | T12 | H | H | H | +3 |

MEMORY SYSTEMS AND DEVICES THAT SUPPORT METHODS FOR CALIBRATING INPUT OFFSETS THEREIN

REFERENCE TO PRIORITY APPLICATION

This application claims priority under 35 U.S.C. § 119 to Korean Patent Application No. 10-2023-0028238, filed Mar. 3, 2023, the disclosure of which is hereby incorporated herein by reference.

BACKGROUND

Embodiments of the present disclosure described herein relate to integrated circuit memory devices and, more particularly, to memory devices included within a memory system and methods for calibrating an input offset therein.

Semiconductor memory devices are classified into volatile memory devices and nonvolatile memory devices. Volatile memory devices, such as dynamic random access memory (DRAM) devices and static random access memory (SRAM) devices, typically have relatively high reading and writing speeds, but lose their stored data when their power supplies are interrupted. In contrast, nonvolatile memory devices can retain their stored data even when their power supplies are interrupted.

A representative example of volatile memory is a DRAM. A memory cell of a volatile memory may include a single N-type "access" transistor, serving as a switch, and a single capacitor storing electric charges (data). Binary information "1" or "0" may correspond to the presence or absence of the electric charges stored in the capacitor in the memory cell, for example, whether a terminal voltage of a cell capacitor is high or low. A memory cell may be connected to a wordline and a bitline. The bitline may be connected to a sense amplifier. The sense amplifier may sense data, stored in the memory cell, through a bitline based on a voltage applied to the wordline and gate terminals of multiple access transistors within the same row.

A volatile memory may receive and store data from an external device, such as a memory controller, and may convert an analog signal input through an input buffer into a digital signal. However, due to a potential input offset existing within the input buffer, an error may occur during an analog-to-digital conversion process. In order to correct an error caused by such an input offset, the volatile memory may perform an input offset calibration operation.

SUMMARY

Embodiments of the present disclosure provide a memory device obtaining an offset calibration code for an input buffer circuit before receiving a mode register code, and having an effect to shift the offset calibration code by adjusting a current amount supplied to a current element connected to an input terminal of the input buffer circuit after receiving the mode register code.

According to an embodiment, a memory device includes a memory cell array and an input input/output circuit. The input/output circuit is configured to compare first data received via a data pad with a reference voltage, and generate second data based on the comparison, which is stored in the memory cell array. Control logic is also provided, which is configured to provide a mode register code including gain information (of the input/output circuit) to the input/output circuit. The input/output circuit is further configure to: (i) generate an offset calibration code corresponding to a first input offset of the input/output circuit based on the second data, and before receiving the mode register code, (ii) change a gain of an input buffer corresponding to the mode register code after receiving the mode register code, and (iii) calibrate a second input offset corresponding to the changed gain of the input buffer by adjusting a current amount applied to a current element connected to an input terminal of the input buffer based on the offset calibration code and the mode register code.

According to another embodiment, a memory device includes a memory cell array, and an input/output circuit configured to compare first data received via a data pad with a reference voltage, to thereby sample second data, which is stored in the memory cell array. The input/output circuit can includes: (i) an input buffer circuit connected to the data pad and configured to output the second data by comparing the first data with the reference voltage, (ii) a current switch circuit configured to supply current to at least one input terminal of the input buffer circuit, (iii) offset calibration logic, which is configured to generate an offset calibration code corresponding to a first input offset of the input buffer circuit based on the second data, before receiving a mode register code including gain information of the input buffer circuit, (iv) a thermometer code generator configured to convert the offset calibration code into a thermometer code corresponding to the number of current sources included in the current switch circuit, (v) a gain code decoder configured to convert the mode register code into a gain information code corresponding to gain values used in the input buffer circuit, and (vi) a code shifter configured to generate a code shift signal for controlling the current switch circuit by combining the gain information code or the thermometer code. In some embodiments, the current switch circuit adjusts a current amount applied to a current element connected to at least one input terminal of the input buffer based on the code shift signal such that a second input offset corresponding to the changed gain of the input buffer circuit is calibrated after the mode register code is received.

According to another embodiment, a method of calibrating an input offset of a memory device includes: generating an offset calibration code corresponding to a default gain of the input buffer circuit, generating a thermometer code based on the offset calibration code, generating a first code shift signal based on the thermometer code, supplying a first calibration current to a current element connected to an input terminal of the input buffer circuit based on the first code shift signal, decoding a mode register code to generate a gain information code determining a gain of the input buffer circuit when the mode register code is received, applying the gain information code to the input buffer circuit, generating a second code shift signal based on the gain information code and the thermometer code, and supplying a second calibration current to the current element connected to the input terminal of the input buffer circuit based on the second code shift signal.

BRIEF DESCRIPTION OF THE FIGURES

The above and other objects and features of the present disclosure will become apparent by describing in detail embodiments thereof with reference to the accompanying drawings.

FIG. 4 is a table illustrating an example embodiment of mode register codes, gain information codes, and offset calibration code related to an input buffer circuit of FIG. 3.

FIG. 6 is a table illustrating an example embodiment of thermometer codes generated by a thermometer code generator of FIG. 5.

FIG. 9 is a diagram illustrating an example embodiment of logic for performing a code-down operation in the code shifter of FIG. 5.

FIG. 10 is a diagram illustrating an example embodiment of logic for performing a code up operation in the code shifter of FIG. 5.

FIG. 11 is a diagram illustrating a truth table of current switch signals input to current switches of FIG. 8 through a code shift operation of the code shifter of FIG. 5.

DETAILED DESCRIPTION

Below, embodiments of the present disclosure will be described in detail and clearly to such an extent that an ordinary one in the art easily implements the invention.

Below, a DRAM will be used as an example for illustrating features and functions of the present disclosure. However, other features and performances may be easily understood from information disclosed herein by a person of ordinary skill in the art. The present disclosure may be implemented by other embodiments or applied thereto. Further, the detailed description may be modified or changed according to viewpoints and applications without escaping from the scope, spirit, and other objects of the present disclosure.

Figure 1:
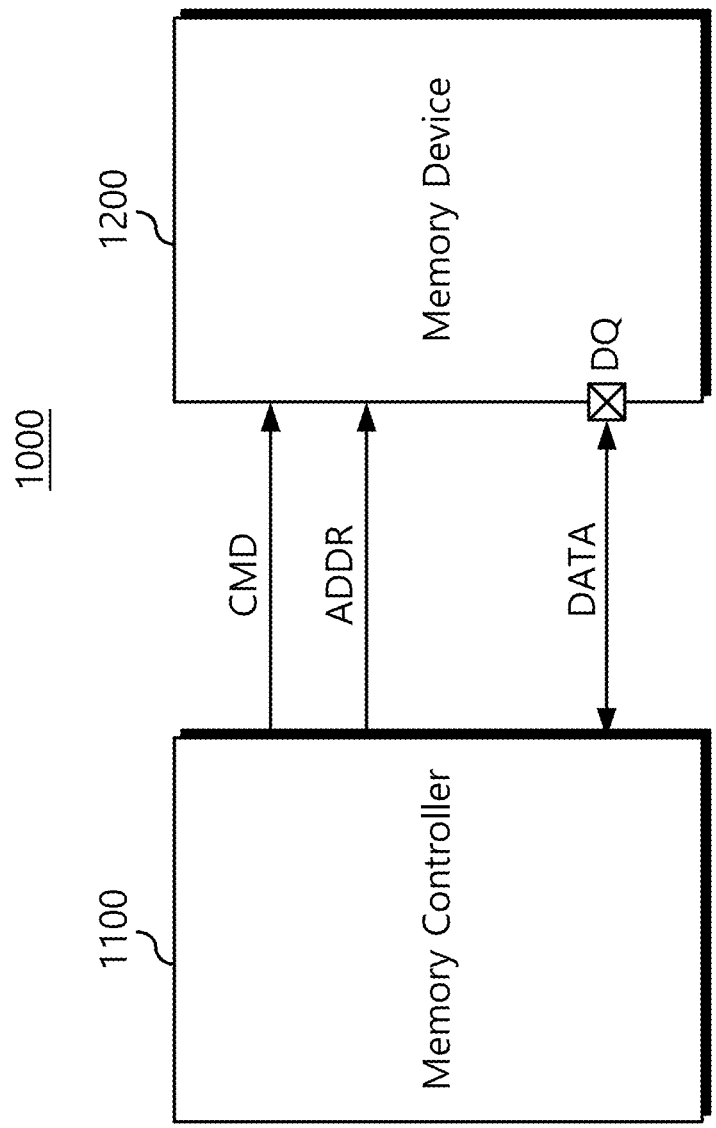
FIG. 1 is a block diagram illustrating a memory system according to an example embodiment.

FIG. 1 is a block diagram illustrating a memory system according to an example embodiment. Referring to FIG. 1, a memory system 1000 according to the present embodiment may include a memory controller 1100 and a memory device 1200. In some embodiments, the memory controller 1100 may perform an access operation to write data in the memory device 1200 or to read data stored in the memory device 1200. For example, the memory controller 1100 may generate a command CMD and an address ADDR for writing data in the memory device 1200 or reading data stored in the memory device 1200. The memory controller 1100 may include at least one of a memory controller controlling the memory device 1200, a system-on-chip (SoC) such as an application processor (AP), a central processing unit (CPU), a digital signal processor (DSP), and a graphics processing unit (GPU).

In addition, the memory controller 1100 may provide various signals to the memory device 1200 to control an overall operation of the memory device 1200. For example, the memory controller 1100 may control memory access operations of the memory device 1200 such as a read operation and a write operation. The memory controller 1100 may provide the command CMD and the address ADDR to the memory device 1200 to write data DATA into the memory device 1200 or to read data DATA from the memory device 1200.

According to a further example embodiment, the memory controller 1100 may generate various types of commands CMD to control the memory device 1200. For example, the memory controller 1100 may generate a bank request corresponding to a bank operation of changing a state of a memory bank, among memory banks, to read data DATA or write data DATA. As an example, the bank request may include an active request for changing a state of a memory bank, among the memory banks, to an active state. The memory device 1200 may activate a row included in the memory bank, for example, a wordline, in response to the active request. The bank request may include a precharge request for changing the memory banks from an active state to a standby state after reading or writing of data DATA is completed. In addition, the memory controller 1100 may generate an input/output (I/O) request (e.g., a column address strobe (CAS) request) for the memory device 1200 to perform a read operation or a write operation of data DATA. As an example, the I/O request may include a read request for reading data DATA from activated memory banks. The I/O request may include a write request for writing data DATA in the activated memory banks. The memory controller 1100 may generate a refresh command to control a refresh operation on the memory banks. However, the types of commands CMD described herein are merely exemplary, and other types of commands CMD may be present.

According to another example embodiment, the memory device 1200 may output data DATA, requested to be read by the memory controller 1100, to the memory controller 1100 or may store data DATA, requested to be written by the memory controller 1100, in a memory cell of the memory device 1200. The memory device 1200 may input and output data DATA based on the command CMD and the address ADDR. The memory device 1200 may include memory banks. The memory device 1200 may include at least one of a data pad DQ. The memory device 1200 may input and output data DATA through the data pad DQ. The data pad DQ may be connected to an input/output (I/O) circuit.

The memory device 1200 may be a volatile memory device such as a dynamic random access memory (DRAM), a synchronous dynamic random access memory (SDRAM), a double data rate (DDR) DRAM, a DDR SDRAM, a low-power double data rate (LPDDR) SDRAM, a graphics double data rate (GDDR) SDRAM, a Rambus dynamic random access memory (RDRAM), and a static random access memory (SRAM), or the like. Alternatively, the memory device 1200 may be implemented as a nonvolatile memory device such as a resistive RAM (RRAM), a phase change memory (PRAM), a magnetoresistive memory (MRAM), a ferroelectric memory (FRAM), a spin-transfer torque RAM (STT-RAM), or the like. In the present specification, the advantages of the present disclosure have been described with respect to a DRAM, but example embodiments are not limited thereto.

According to another example embodiment, the memory banks may include a memory cell array divided in units of banks, a row decoder, a column decoder, a sense amplifier, a write driver, or the like. The memory banks may store data DATA, requested to be written into the memory device 1200, through the write driver and may read data DATA, requested to be read, using the sense amplifier. The memory banks may further include a component for a refresh operation of storing and maintaining data in the cell array, or select circuits based on an address.

Figure 2:
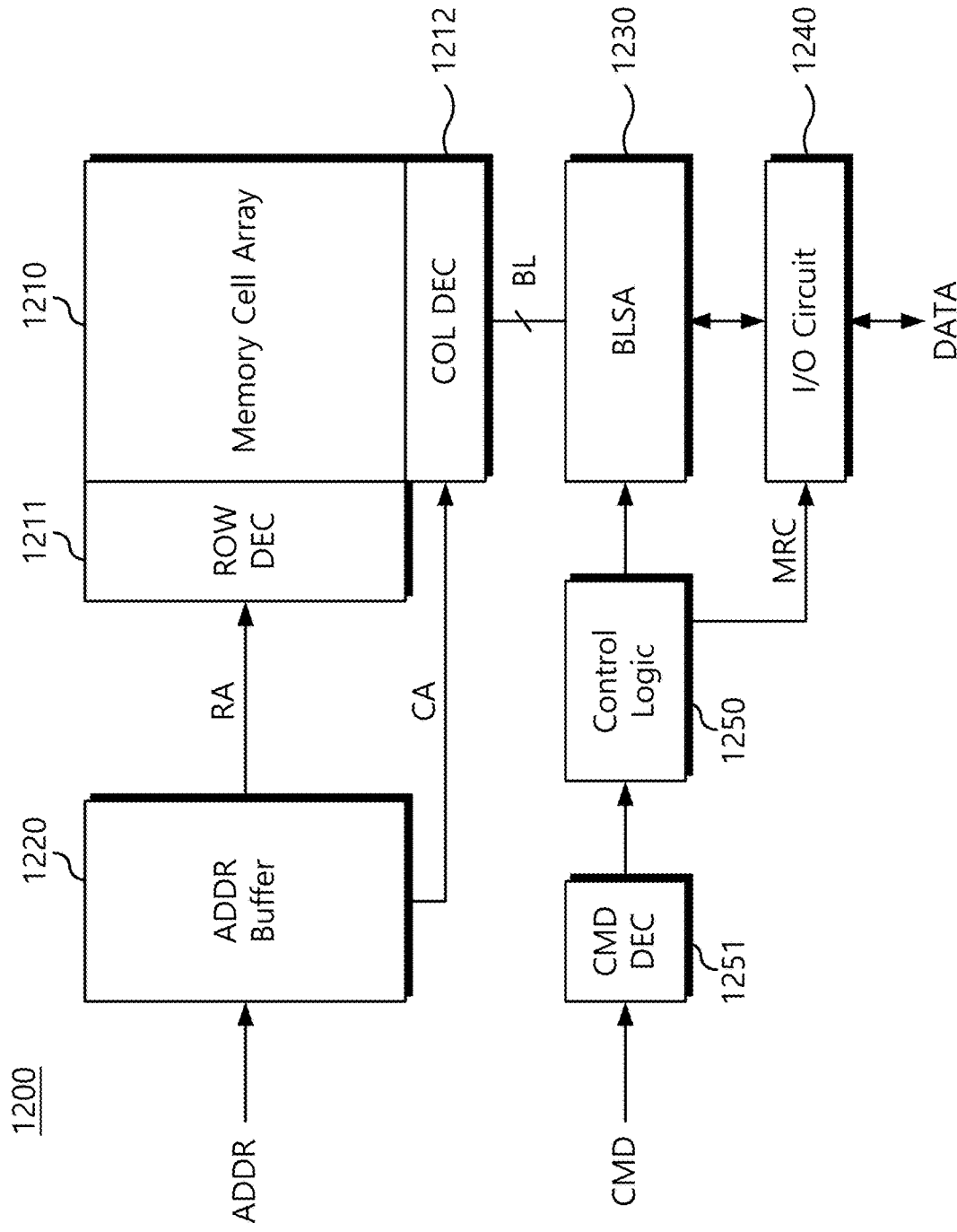
FIG. 2 is a block diagram illustrating a memory device of FIG. 1.

Referring now to FIG. 2, the memory device 1200 according to an embodiment may include a memory cell array 1210, a row decoder 1211, a column decoder 1212, an address buffer 1220, a bitline sense amplifier 1230, an input/output circuit 1240, a command decoder 1251, and control logic 1250, electrically connected as illustrated. In some embodiments, the memory cell array 1210 may include a plurality of memory cells arranged in a matrix of rows and columns. For example, the memory cell array 1210 may include a plurality of wordlines and a plurality of bitlines BL connected to memory cells. The plurality of wordlines may be connected to rows of the memory cells, and the plurality of bitlines BL may be connected to columns of the memory cells.

According to an example embodiment, the address buffer 1220 may receive an address ADDR from the memory controller 1100 of FIG. 1. For example, the address ADDR may include a row address RA addressing a row of the memory cell array 1210 and a column address CA addressing a column of the memory cell array 1210. The address buffer 1220 may transmit the row address RA to the row decoder 1211 and may transmit the column address CA to the column decoder 1212.

According to an example embodiment, the row decoder 1211 may select one of the plurality of wordlines connected to the memory cell array 1210. The row decoder 1211 may decode the row address RA, received from the address buffer 1220, to select a single wordline corresponding to the row address RA and may activate the selected wordline. According to an example embodiment, the column decoder 1212 may select a predetermined bitline from among the plurality of bitlines BL of the memory cell array 1210. The column decoder 1212 may decode the column address CA, received from the address buffer 1220, and then select the predetermined bitline BL corresponding to the column address CA.

According to a further embodiment, the bitline sense amplifier 1230 may be connected to the bitlines BL of the memory cell array 1210. For example, the bitline sense amplifier 1230 may sense a change in voltage of a selected bitline, among the plurality of bitlines BL, and may amplify and output the change in voltage.

According to an example embodiment, the input/output circuit 1240 may output data DATA to the memory controller 1100 via data lines based on a sensed and amplified voltage from the bitline sense amplifier 1230. For example, the input/output circuit 1240 may include an input buffer or an output buffer. The input buffer or the output buffer may be connected to the data pad DQ of FIG. 1. The input/output circuit 1240 may include an offset calibration circuit, which is configured to calibrate an input offset of the input buffer.

According to an example embodiment, the command decoder 1251 may decode a write enable signal/WE, a row address strobe signal/RAS, a column address strobe signal/CAS, and a chip select signal/CS received from the memory controller 1100, such that control signals corresponding to the command CMD are generated in the control logic 1250. The command CMD may include an active request, a read request, a write request, or a precharge request. The control logic 1250 may control an overall operation of the bitline sense amplifier 1230 through the control signals corresponding to the command CMD. The control logic 1250 may transmit a mode register code MRC to the input/output circuit 1240. The mode register code MRC may include gain information of an input buffer included in the input/output circuit 1240.

Figure 3:
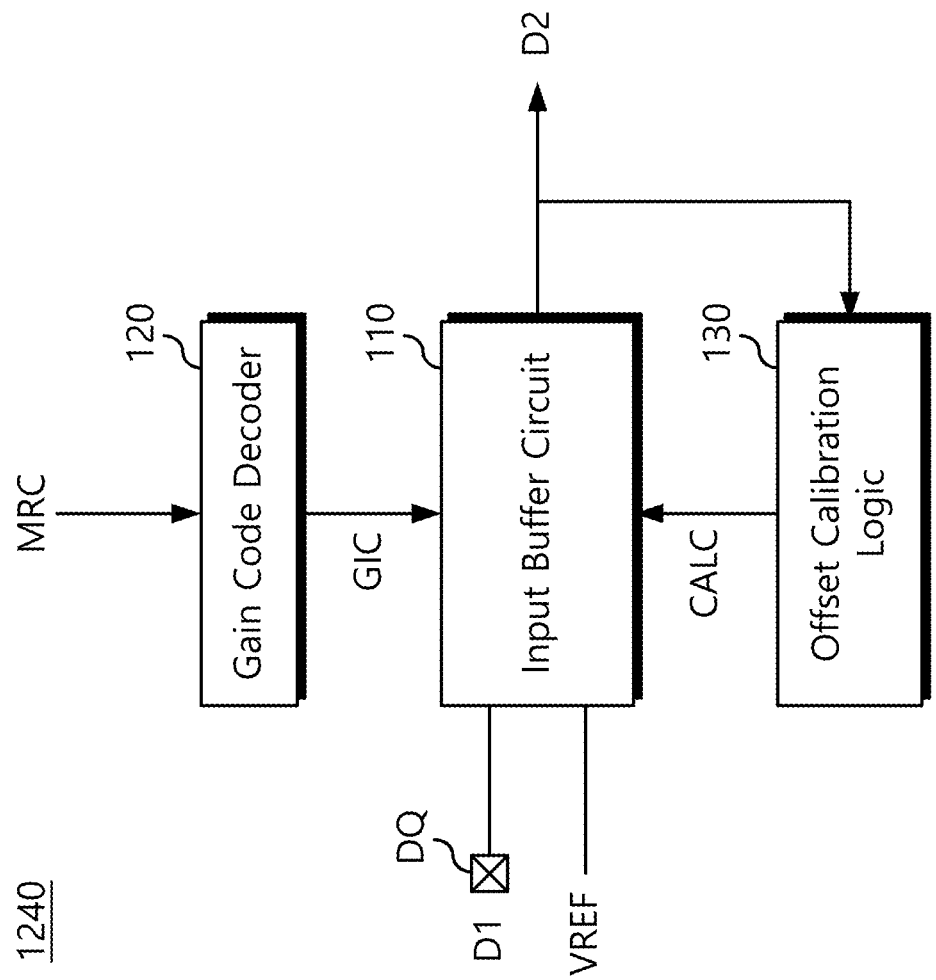
FIG. 3 is a diagram illustrating an input/output circuit of FIG. 2.

FIG. 3 is a diagram illustrating an embodiment of the input/output circuit of FIG. 2, whereas FIG. 4 is a table illustrating an example embodiment of mode register codes, gain information codes, and offset calibration codes related to an embodiment of the input buffer circuit of FIG. 3. Referring to FIGS. 3 and 4, the input/output circuit 1240 may include an input buffer circuit 110, a gain code decoder 120 and an offset calibration logic 130. FIG. 3 illustrates one input buffer circuit 110 connected to one data pad DQ as an example. However, the input/output circuit 1240 may include a plurality of input buffer circuits respectively connected to a plurality of data pads.

According to an example embodiment, the input buffer circuit 110 may receive first data D1 from the memory controller 1100 of FIG. 1, via the data pad DQ. The input buffer circuit 110 may output second data D2 in response to the first data D1. For example, the first data D1 may be an analog signal, and the input buffer circuit 110 may convert this analog first data signal D1 into a digital signal, which is referred to herein as second data D2. The input buffer circuit 110 may output the second data D2 in response to comparing the "analog" first data D1 against a fixed reference voltage VREF. As an example, when the first data D1 is greater than the reference voltage VREF, the input buffer circuit 110 may output a high level (or logic 1) as the second data D2. In contrast, when the first data D1 is less than the reference voltage VREF, the input buffer circuit 110 may output a low level (or logic 0) as the second data D2. Upon generation, the second data D2 may be transmitted to the bit line sense amplifier 1230 of FIG. 2 and stored in the memory cell array 1210.

According to an example embodiment, the gain code decoder 120 may provide a gain information code GIC to the input buffer circuit 110. For example, the gain code decoder 120 may receive a mode register code MRC from the control logic 1250 of FIG. 2. The mode register code MRC may include gain information to be applied to the input buffer circuit 110. The gain code decoder 120 may convert the mode register code MRC into the gain information code GIC. The input buffer circuit 110 may set a gain to be applied when converting the first data D1 based on the gain information code GIC (or mode register code MRC). As an example, referring to FIG. 4, the mode register code MRC may be composed of 3-bit codes (e.g., 011, 010, 001, 000, 101, 110, 111). The gain information code GIC may be composed of codes (e.g., default gain code GI0, a first gain code GI1 to a third gain code GI3, a fifth gain code GI5 to a seventh gain code GI7) corresponding to designated gain values (e.g., 6 dB, 4 dB, 2 dB, 0 dB, −2 dB, −4 dB, −6 dB) respectively.

According to an example embodiment, the offset calibration logic 130 may generate an offset calibration code CALC based on the second data D2. For example, the offset calibration logic 130 may check an input offset based on the measured second data D2 after connecting the data pad DQ and a terminal of the reference voltage VREF to an interlocking source. The offset calibration logic 130 may generate the offset calibration code CALC based on the input offset. The input buffer circuit 110 may adjust a current amount of an input terminal of the input buffer circuit 110 based on the offset calibration code CALC, and thus the input offset of the input buffer circuit 110 may be calibrated.

However, in order not to adversely affect a write operation of the memory device 1200, the offset calibration logic 130 may perform an offset calibration operation before the write operation. Accordingly, before the input buffer circuit 110 may receive the mode register code MRC, the offset calibration logic 130 may perform the offset calibration operation. Since the gain of the input buffer circuit 110 is changed when the input buffer circuit 110 may receive the mode register code MRC, the input offset of the input buffer circuit 110 may also change. As an example, referring to FIG. 4, the offset calibration code CALC (e.g., an offset calibration code to be measured when the gain of the input buffer circuit 110 is set to one of 6 dB, 4 dB, 2 dB, 0 dB, −2 dB, −4 dB and −6 dB from the beginning) may not be the same for each gain of the input buffer circuit 110. Prior to receiving the mode register code MRC, the input buffer circuit 110 may be set to a default gain, such as 0 dB. Accordingly, the offset calibration logic 130 may provide the input buffer circuit 110 with an offset calibration code CALC corresponding to the default gain (e.g., 0 dB). Then, when the mode register code MRC is received, the gain of the input buffer circuit 110 is changed so that the offset calibration code CALC also has to be changed. However, because it takes a relatively long time to drive the offset calibration logic 130 again after the mode register code MRC is received, the performance of the memory device 1200 may be reduced. Furthermore, since many flip-flops may be required to shift the offset calibration code CALC, an area of the memory device 1200 may increase.

Figure 5:
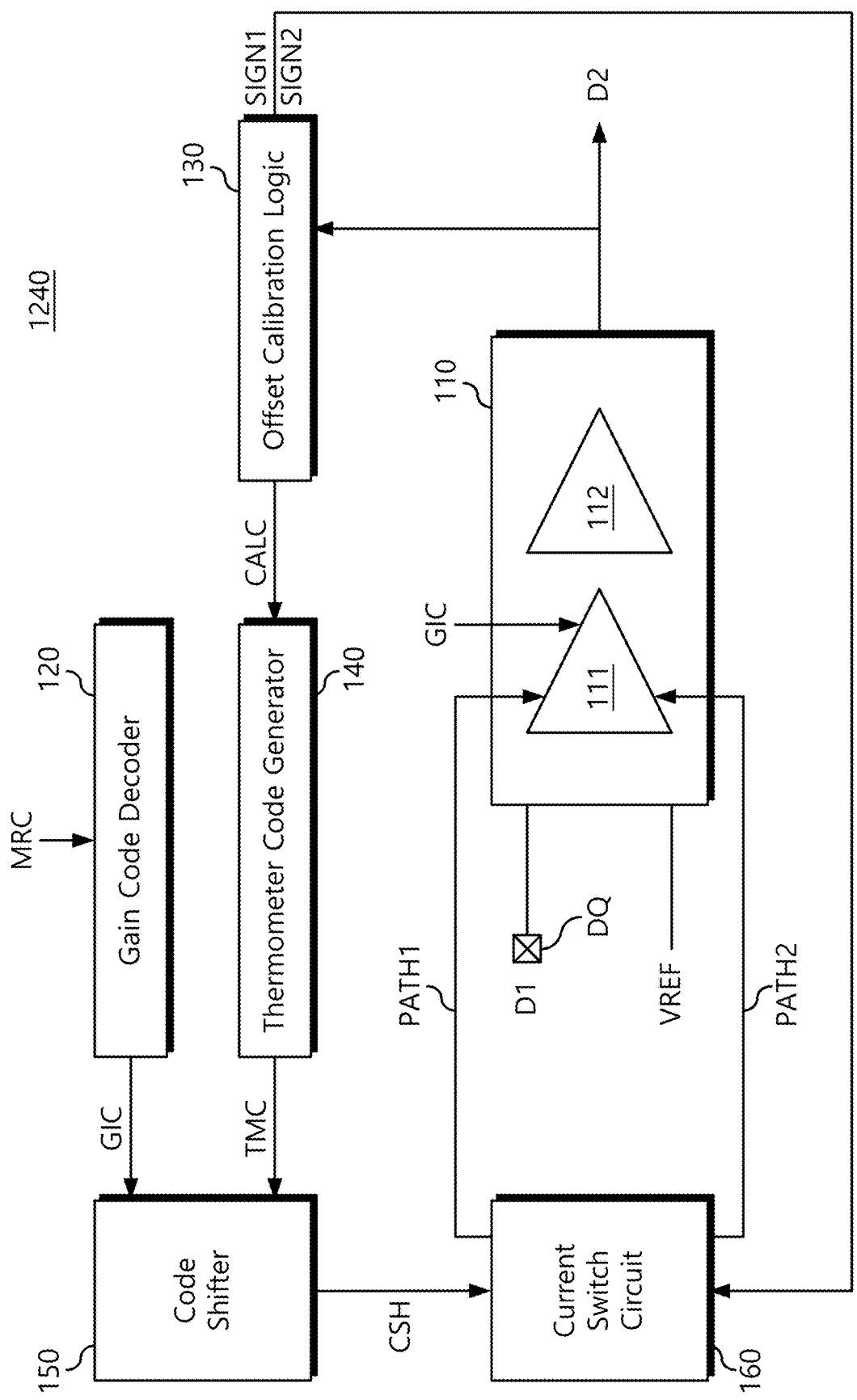
FIG. 5 is a block diagram illustrating the input/output circuit of FIG. 2 including a code shifter.
Figure 7:
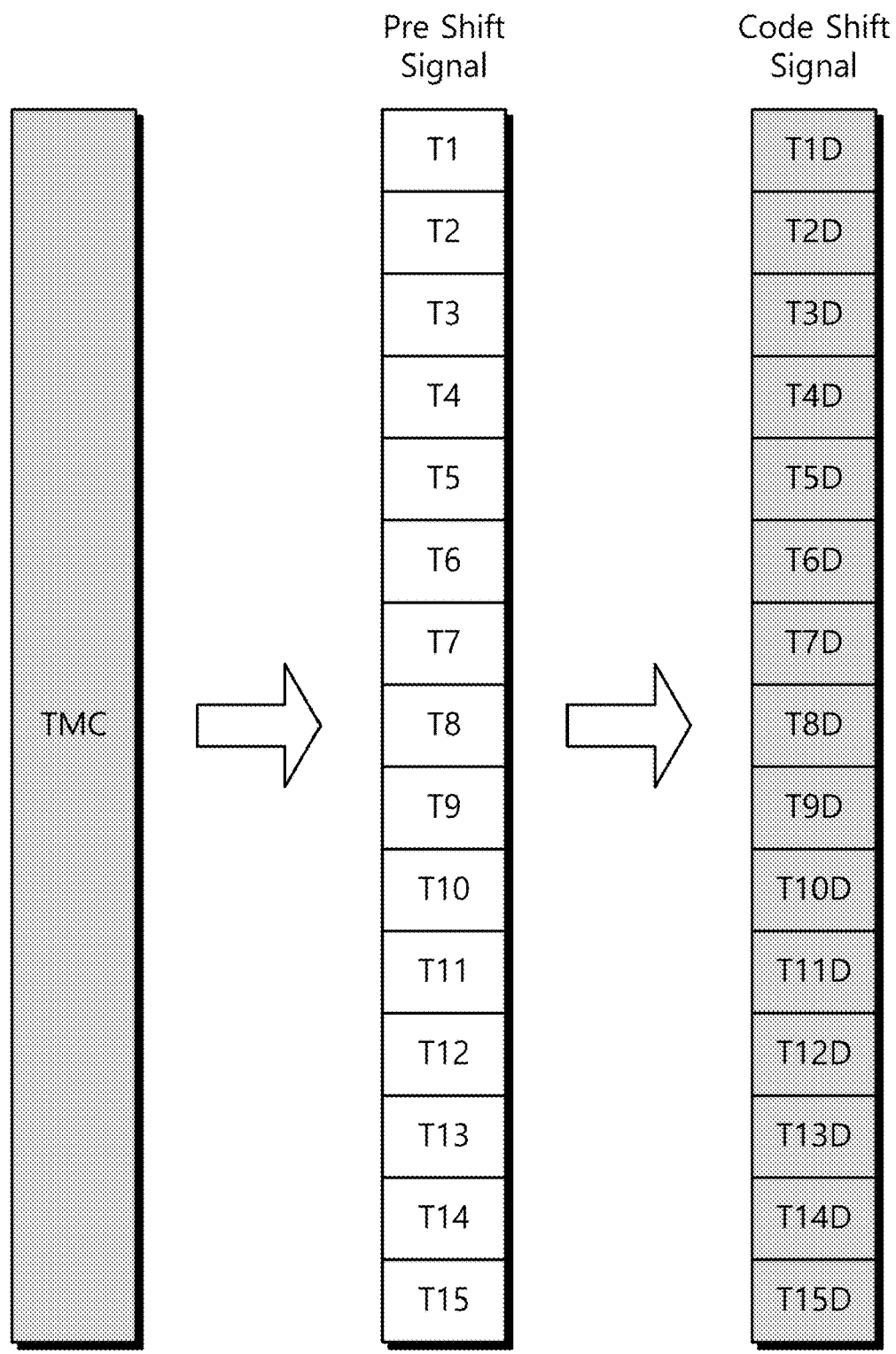
FIG. 7 is a diagram illustrating an example embodiment of a code shift signal output from the code shifter of FIG. 5.

FIG. 5 is a block diagram illustrating an embodiment of the input/output circuit of FIG. 2, and includes a code shifter. FIG. 6 is a table illustrating an example embodiment of thermometer codes generated by a thermometer code generator of FIG. 5. FIG. 7 is a diagram illustrating an example embodiment of a code shift signal output from the code shifter of FIG. 5. Referring to FIGS. 5 and 7, the input/output circuit 1240 may include an input buffer circuit 110, a gain code decoder 120, an offset calibration logic 130, a thermometer code generator 140, a code shifter 150, and a current switch circuit 160, as shown. According to an example embodiment, the input buffer circuit 110 may receive a first data D1 from the memory controller 1100 of FIG. 1 via the data pad DQ. The input buffer circuit 110 may output a second data D2 in response to the first data D1. For example, the input buffer circuit 110 may include a first input buffer 111 and a second input buffer 112. A gain of the first input buffer 111 may be changed based on a gain information code GIC received from the gain code decoder 120. The first input buffer 111 may compare the first data D1 (e.g., an analog signal) against a reference voltage VREF, and generate an intermediate digital signal based on a gain according to the gain information code GIC. The second input buffer 112 may sample the intermediate digital signal based on a specified gain regardless of the gain information code GIC. The second input buffer 112 may output the second data D2 by comparing the intermediate digital signal with the reference voltage VREF. In this regard, if the gain of the first input buffer 111 is changed based on the gain information code GIC, and the offset calibration code CALC generated before receiving the mode register code MRC is used, an input offset of the first input buffer 111 (or the input buffer circuit 110) may not be fully calibrated.

According to an example embodiment, the gain code decoder 120 may convert the mode register code MRC into the gain information code GIC. For example, the mode register code MRC may include gain information to be applied to the input buffer circuit 110. The gain code decoder 120 may convert the mode register code MRC into the gain information code GIC corresponding to gain values of the first input buffer 111. The gain code decoder 120 may provide the gain information code GIC to the first input buffer 111. As an example, referring to FIG. 4, the mode register code MRC may be composed of 3-bit codes (e.g., 011, 010, 001, 000, 101, 110, 111). The gain information code GIC may be composed of codes (e.g., a default gain code GI0, a first gain code GI1 to a third gain code GI3, a fifth gain code GI5 to a seventh gain code GI7) corresponding to designated gain values (e.g., 6 dB, 4 dB, 2 dB, 0 dB, −2 dB, −4 dB, −6 dB) respectively. In addition, the gain code decoder 120 may transmit the gain information code GIC to the code shifter 150.

According to an example embodiment, the offset calibration logic 130 may generate the offset calibration code CALC based on the second data D2. For example, the offset calibration logic 130 may check the input offset based on the measured second data D2 after connecting the data pad DQ and a terminal of the reference voltage VREF to an interlocking source. The offset calibration logic 130 may generate the offset calibration code CALC based on the input offset. As an example, the offset calibration logic 130 may generate the offset calibration code CALC before receiving the mode register code MRC. The offset calibration logic 130 may transmit the offset calibration code CALC to the thermometer code generator 140. Furthermore, the offset calibration logic 130 may generate shift direction signals SIGN1 and SIGN2 corresponding to the offset calibration code CALC. The shift direction signals SIGN1 and SIGN2 may be transmitted to the current switch circuit 160 and determine a direction of a code shift.

According to an example embodiment, the thermometer code generator 140 may convert the offset calibration code CALC into a thermometer code TMC. For example, the offset calibration code CALC may be composed of 4-bit codes (e.g., 0000 to 1111). The thermometer code TMC may be composed of codes corresponding to the number of current switches included in the current switch circuit 160. As an example, referring to FIG. 6, the thermometer code TMC may correspond to the offset calibration code CALC one-to-one. As the offset calibration code CALC increases, the number of "1s" included in the thermometer code TMC may increase by one. The number of "1s" included in the thermometer code TMC may correspond to the number of current switches turned on in the current switch circuit 160. The thermometer code generator 140 may transmit the thermometer code TMC to the code shifter 150.

According to an example embodiment, the code shifter 150 may generate a code shift signal CSH based on the gain information code GIC or the thermometer code TMC. For example, before receiving the mode register code MRC, the code shifter 150 may generate the code shift signal CSH based only on the thermometer code TMC corresponding to the offset calibration code CALC. After receiving the mode register code MRC, the code shifter 150 may generate the code shift signal CSH based on the gain information code GIC corresponding to the mode register code MRC and the thermometer code TMC corresponding to the offset calibration code CALC. The current switch circuit 160 may adjust a calibration current for the current element connected to one of the input terminals of the first input buffer 111 based on the code shift signal CSH, and through this, an effect of shifting the offset calibration code CALC may be represented. The code shifter 150 may convert the thermometer code TMC into pre-switch signals T1 to T15.

As an example, the code shifter 150 may include at least one logic circuit. At least one logic circuit may generate a modified code shift signal CSH by combining the gain information code GIC and some of the pre-switch signals T1 to T15. Based on a required amount of code shift in FIG. 4, code down logic and code up logic may be set. The required amount of code shift may be determined based on a difference between an offset calibration code CALC (e.g., 0111) of a default gain (e.g., 0 dB) and an offset calibration code CALC corresponding to each gain. Based on the code down logic and the code up logic, at least one logic circuit of the code shifter 150 may be configured.

According to an example embodiment, the code shifter 150 may convert each component of the thermometer code TMC into a pre-shift signal corresponding to each current switch included in the current switch circuit 160. Furthermore, the code shifter 150 may convert the pre-shift signal into the code shift signal CSH. A portion of the code shift signal CSH may have the same value as the pre-shift signal. Another portion of the code shift signal CSH may be determined by a logical operation of the pre-shift signal and the gain information code GIC. As an example, referring to FIG. 7, the pre-shift signal may include a first pre-switch signal T1 to a fifteenth pre-switch signal T15. The first pre-switch signal T1 to the fifteenth pre-switch signal T15 may correspond to each component of the thermometer code TMC. Each of the first pre-switch signal T1 to the fifteenth pre-switch signal T15 may have a high level (or logic 1) or a low level (or logic 0). The code shift signal CSH may include a first switch signal T1D to a fifteenth switch signal T15D. The first switch signal T1D to the fifteenth switch signal T15D may be input to each of the current switches included in the current switch circuit 160. Each of the first switch signal T1D to the fifteenth switch signal T15D may have a high level (e.g., logic 1) or a low level (e.g., logic 0).

According to one embodiment, the current switch circuit 160 may adjust a current amount supplied to a current element connected to one of the input terminals of the first input buffer 111 based on the shift direction signals SIGN1 and SIGN2 and the code shift signal CSH. Through this, an effect of shifting the offset calibration code CALC may occur. For example, the current switch circuit 160 may include at least one current source which is turned on or off based on at least one switch signal. As an example, the current switch circuit 160 may include the number of current switches corresponding to the thermometer code TMC. The current switches may be turned on or off based on the thermometer code TMC. The current switch circuit 160 may initially turn on the current switches (e.g., 7 current switches) based on the default gain (e.g., 0 dB) or the code shift signal CSH corresponding to the offset calibration code CALC. After the mode register code MRC is received, the current switch circuit 160 may turn off some of the turned on current switches based on a code shift signal CSH changed according to the mode register code MRC. Alternatively, the current switch circuit 160 may turn on some of the turned off current switches based on the changed code shift signal CSH. By turning off or turning on some of the current switches, the current switch circuit 160 may generate an effect in which the offset calibration code CALC is shifted according to the mode register code MRC. Furthermore, according to an offset position of the first input buffer 111, the current switch circuit 160 may determine an input position of the calibration current by the current switches based on the shift direction signals SIGN1 and SIGN2. When receiving the first shift direction signal SIGN1, the current switch circuit 160 may supply calibration current to the first input buffer 111 through the first calibration current path PATH1. When receiving the second shift direction signal SIGN2, the current switch circuit 160 may supply calibration current to the first input buffer 111 through the second calibration current path PATH2.

Figure 8:
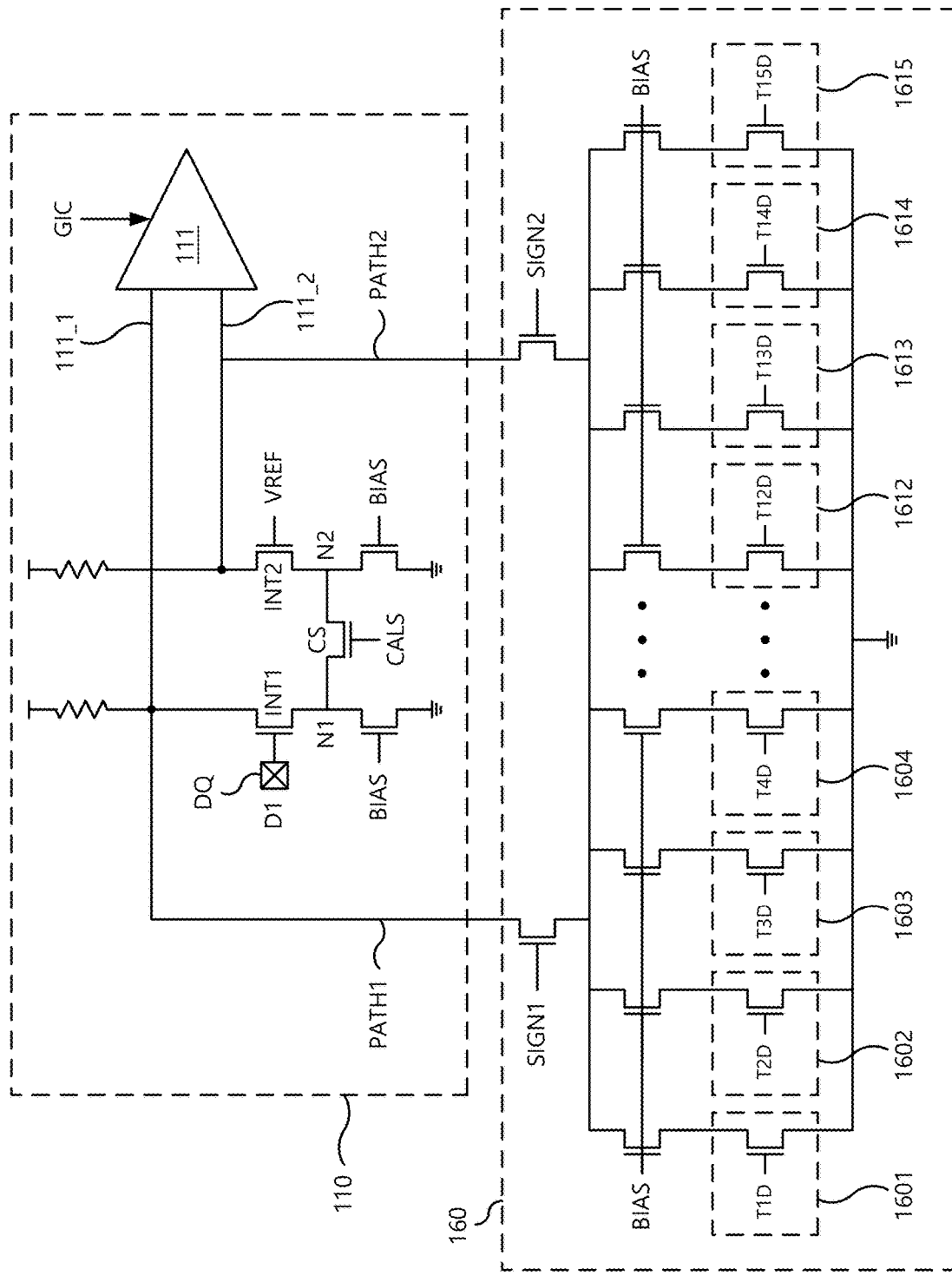
FIG. 8 is a diagram illustrating an example embodiment of an input buffer circuit and a current switch circuit of FIG. 5.

FIG. 8 is a diagram illustrating an example embodiment of an input buffer circuit and a current switch circuit of FIG. 5. Referring to FIGS. 5 and 8, the current switch circuit 160 may include at least one current switch, such as a first current switch 1601 to a fifteenth current switch 1615. According to an example embodiment, the input buffer circuit 110 may include an input transistor (or current device) connected to the first input buffer 111. For example, the input buffer circuit 110 may include a first input transistor INT1 connected to a first input terminal 111_1 of the first input buffer 111. The input buffer circuit 110 may include a second input transistor INT2 connected to a second input terminal 111_2 of the first input buffer 111. A gate of the first input transistor INT1 may be connected to the data pad DQ, a source of the first input transistor INT1 may be connected to a first node N1, and a drain of the first input transistor INT1 may be connected to the first input terminal 111_1 of the first input buffer 111. The reference voltage VREF may be applied with a gate of the second input transistor INT2, a source of the second input transistor INT2 may be connected to a second node N2, and a drain of the second input transistor INT2 may be connected to the second input terminal 111_2 of the first input buffer 111. A calibration short transistor CS may be connected between the first node N1 and the second node N2. When the calibration short signal CALS is activated, the calibration short transistor CS may short the first node N1 and the second node N2. Alternatively, when the calibration short signal CALS is activated, the data pad DQ and the input terminal of the reference voltage VREF may be interlocked. The calibration short signal CALS may be generated by the control logic 1250 of FIG. 2 or the offset calibration logic 130 of FIG. 5. After the calibration short signal CALS is activated and the first node N1 and the second node N2 are shorted, the offset calibration logic 130 may generate the offset calibration code CALC.

According to one embodiment, the current switch circuit 160 may include at least one current source. However, this is only one example, and the number of current sources may be set in various ways. For example, the current switch circuit 160 may include a first current switch 1601 to a fifteenth current switch 1615. The first current switch 1601 to the fifteenth current switch 1615 may be turned on or off based on a first switch signal T1D to a fifteenth switch signal T15D, respectively. The first switch signal T1D to the fifteenth switch signal T15D may be received from the code shifter 150. The first switch signal T1D to the fifteenth switch signal T15D may be included in the code shift signal CSH. When the first shift direction signal SIGN1 is activated, a calibration current through the turned on current switches may be supplied to the input transistor INT1 connected to the first input terminal 111_1 of the first input buffer 111 through the first calibration current path PATH1. When the second shift direction signal SIGN2 is activated, a calibration current through the turned on current switches may be supplied to the second input transistor INT2 connected to the second input terminal 111_2 of the first input buffer 111 through the second calibration current path PATH2.

FIG. 9 is a diagram illustrating an example embodiment of logic for performing a code-down operation in the code shifter of FIG. 5. FIG. 10 is a diagram illustrating an example embodiment of logic for performing a code up operation in the code shifter of FIG. 5. FIG. 11 is a diagram illustrating a truth table of current switch signals input to current switches of FIG. 8 through a code shift operation of the code shifter of FIG. 5.

According to an example embodiment, in FIG. 9, the code shifter 150 may generate the code shift signal CSH based on code down logic. For example, based on the code down logic, when receiving a third gain code GI3 (or when a gain of the first input buffer 111 is 6 dB), the code shifter 150 may generate the code shift signal CSH to have an effect that the offset calibration code CALC is shifted by −2. In addition, when receiving a second gain code GI2 (or when a gain of the first input buffer 111 is 4 dB), the code shifter 150 may generate the code shift signal CSH to have an effect that the offset calibration code CALC is shifted by −1.

As an example, the code shifter 150 may include a first logic gate 1501 to a fifth logic gate 1505. The first logic gate 1501 may perform an OR operation on the second gain code GI2 and the third gain code GI3 to output a first intermediate signal GI23. The second logic gate 1502 may invert the first intermediate signal GI23 and output a first inverted intermediate signal GI23B. The third logic gate 1503 may invert the third gain code GI3 to output a third inverted gain code GI3B. The fourth logic gate 1504 may perform an AND operation on the first inverted intermediate signal GI23B and the first pre-switch signal T1 to output the first switch signal T1D. The fifth logic gate 1505 may perform an AND operation on the third inverted gain code GI3B and the second pre-switch signal T2 to output the second switch signal T2D.

That is, when the third gain code GI3 is at a high level (or logic 1), such as when the first input buffer 111 is set to 6 dB, regardless of the first pre-switch signal T1 and the second pre-switch signal T2, the first switch signal T1D and the second switch signal T2D may have a low level (or logic 0). Accordingly, when the third gain code GI3 is at a high level (or logic 1), the first current switch 1601 and the second current switch 1602 may be turned off. In addition, when the second gain code GI2 is at a high level (or logic 1), such as when the first input buffer 111 is set to 4 dB, regardless of the first pre-switch signal T1, the first switch signal T1D may have a low level (or logic 0). Accordingly, when the second gain code GI2 is at a high level (or logic 1), the first current switch 1601 may be turned off.

According to an example embodiment, in FIG. 10, the code shifter 150 may generate the code shift signal CSH based on code up logic. For example, based on the code up logic, when receiving the fifth gain code GI5 (or when a gain of the first input buffer 111 is −2 dB), the code shifter 150 may generate the code shift signal CSH to have an effect that the offset calibration code CALC is shifted by +1. In addition, when receiving the sixth gain code GI6 (or when a gain of the first input buffer 111 is −4 dB), the code shifter 150 may generate the code shift signal CSH to have an effect that the offset calibration code CALC is shifted by +2. In addition, when receiving the seventh gain code GI7 (or when a gain of the first input buffer 111 is −6 dB), the code shifter 150 may generate the code shift signal CSH to have an effect that the offset calibration code CALC is shifted by +3.

As an example, the code shifter 150 may include a sixth logic gate 1506 to a tenth logic gate 1510. The sixth logic gate 1506 may perform an OR operation on the sixth gain code GI6 and the seventh gain code GI7 to output a second intermediate signal GI67. The seventh logic gate 1507 may perform an OR operation on the fifth gain code GI5, the sixth gain code GI6, and the seventh gain code GI7 to output a third intermediate signal GI567. The eighth logic gate 1508 may perform an OR operation on the seventh gain code GI7 and the thirteenth pre-switch signal T13 to output the thirteenth switch signal T13D. The ninth logic gate 1509 may perform an OR operation on the second intermediate signal GI67 and the fourteenth pre-switch signal T14 to output the fourteenth switch signal T14D. The tenth logic gate 1510 may perform an OR operation on the third intermediate signal GI567 and the fifteenth pre-switch signal T15 to output the fifteenth switch signal T15D.

That is, when the fifth gain code GI5 is at a high level (or logic 1), such as when the first input buffer 111 is set to −2 dB, regardless of the fifteenth pre-switch signal T15, the fifteenth switch signal T15D may have a high level (or logic 1). Accordingly, when the fifth gain code GI5 is at a high level (or logic 1), the fifteenth current switch 1615 may be turned on. In addition, when the sixth gain code GI6 is at a high level (or logic 1), such as when the first input buffer 111 is set to −4 dB, regardless of the fourteenth pre-switch signal T14 and the fifteenth pre-switch signal T15, the fourteenth switch signal T14D and the fifteenth switch signal T15D may have a high level (or logic 1). Accordingly, when the sixth gain code GI6 is at a high level (or logic 1), the fourteenth current switch 1614 and the fifteenth current switch 1615 may be turned on. In addition, when the seventh gain code GI7 is at a high level (or logic 1), such as when the first input buffer 111 is set to −6 dB, regardless of the thirteenth pre-switch signal T13, the fourteenth pre-switch signal T14 and the fifteenth pre-switch signal T15, the thirteenth switch signal T13D, the fourteenth switch signal T14D, and the fifteenth switch signal T15D have a high level (or logic 1). Accordingly, when the seventh gain code GI7 is at a high level (or logic 1), the thirteenth current switch 1613, the fourteenth current switch 1614, and the fifteenth current switch 1615 may be turned on.

According to an example embodiment, the first to fifteenth switch signals T1D to T15D input to the first to fifteenth current switches 1601 to 1615 may be determined by the code shifter 150 based on the gain information code GIC (or the mode register code MRC)). For example, referring to FIGS. 8 and 11, when the code shifter 150 receives the default gain code GI0 and the first gain code GI1, each of the first to fifteenth switch signals T1D to T15D may identically correspond to each of the first to fifteenth pre-switch signals T1 to T15. However, when the code shifter 150 receives the second gain code GI2, each of the second to fifteenth switch signals T2D to T15D may identically correspond to each of the second to fifteenth pre-switch signals T2 to T15, and the first switch signal T1D may have a low level (or logic 0) regardless of the first pre-switch signal T1. When the code shifter 150 receives the third gain code GI3, each of the third to fifteenth switch signals T3D to T15D may identically correspond to each of the third to fifteenth pre-switch signals T3 to T15, and the first switch signal T1D and the second switch signal T2D may have a low level (or logic 0) regardless of the first pre-switch signal T1 and the second pre-switch signal T2. When the code shifter 150 receives the fifth gain code GI5, each of the first to fourteenth switch signals T1D to T14D may identically correspond to each of the first to fourteenth pre-switch signals T1 to T14, and the fifteenth switch signal T15D may have a high level (or logic 1) regardless of the fifteenth pre-switch signal T15. When the code shifter 150 receives the sixth gain code GI6, each of the first to thirteenth switch signals T1D to T13D may identically correspond to each of the first to thirteenth pre-switch signals T1 to T13, and the fourteenth switch signal T14D and the fifteenth switch signal T15D have a high level (or logic 1) regardless of the fourteenth pre-switch signal T14 and the fifteenth pre-switch signal T15. When the code shifter 150 receives the seventh gain code GI7, each of the first to twelfth switch signals T1D to T12D may identically correspond to each of the first to twelfth pre-switch signals T1 to T12, and the thirteenth switch signal T13D, the fourteenth switch signal T14D and the fifteenth switch signal T15D may have a high level (or logic 1) regardless of the thirteenth pre-switch signal T13, the fourteenth pre-switch signal T14 and the fifteenth pre-switch signal T15.

As described above, before the mode register code MRC is received, the current switch circuit 160 may provide calibration current to the first input buffer 111 according to the shift signal CSH generated by the code shifter 150 based on the offset calibration code CALC from the offset calibration logic 130. After the mode register code MRC is received, the code shifter 150 may convert the code shift signal CSH by applying both the gain information code GIC into which the mode register code MRC is converted and the thermometer code TMC into which the offset calibration code CALC is converted. And the current switch circuit 160 may provide changed calibration current to the first input buffer 111 based on the changed code shift signal CSH. Accordingly, the input/output circuit 1240 may obtain an effect of shifting the offset calibration code CALC based on the mode register code MRC.

Figure 12:
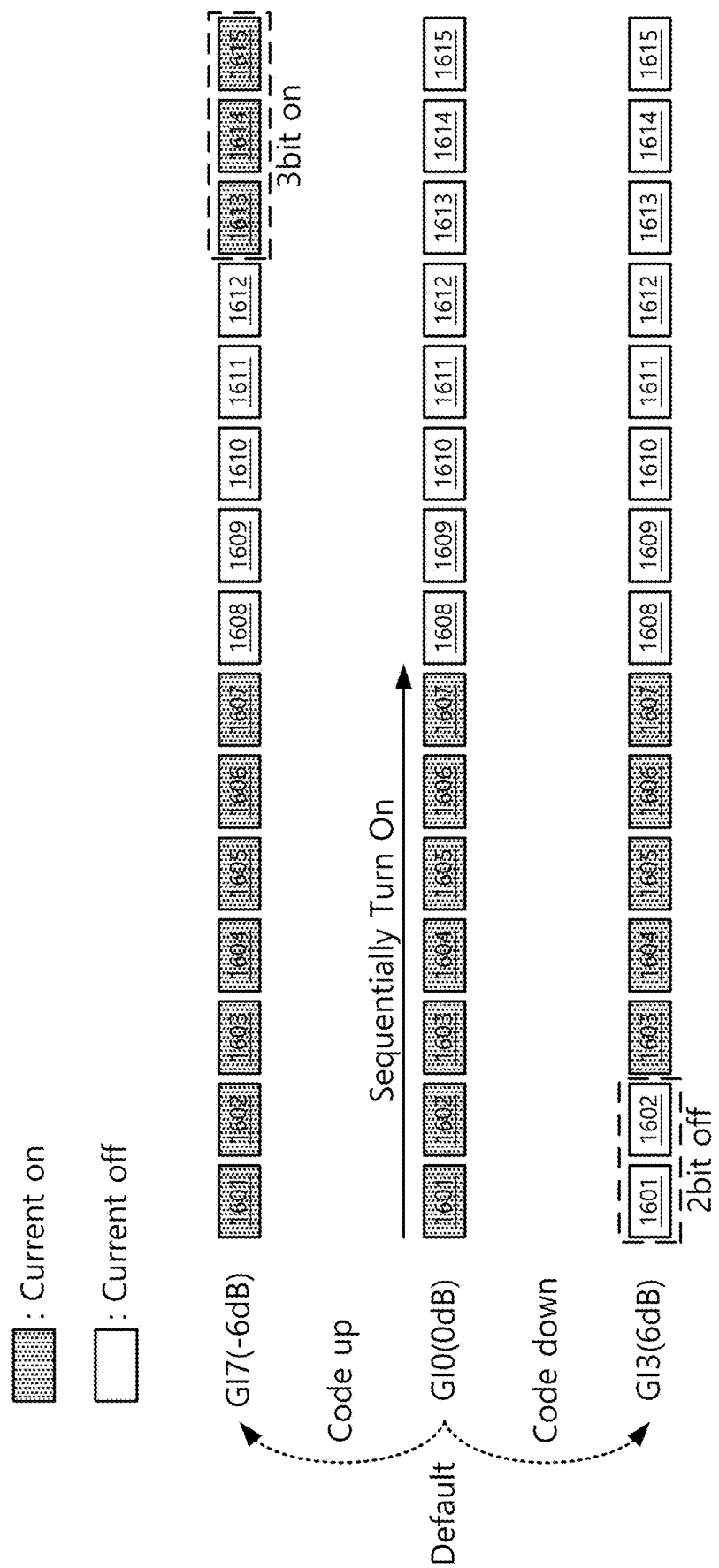
FIG. 12 is a diagram illustrating a shift of an offset calibration code according to turning on or off of the current switch circuit of FIG. 8.

FIG. 12 is a diagram illustrating a shift of an offset calibration code according to turning on or off of the current switch circuit of FIG. 8. Referring to FIGS. 8 and 12, the current switch circuit 160 may initially turn on 7 current switches, such as the first to seventh current switches 1601 to 1607, based on a code shift signal CSH generated based only on an offset calibration code CALC without the mode register code MRC. Since the current switches are turned on or off based on a thermometer code TMC converted from the offset calibration code CALC, the current switches may be turned on sequentially from the first current switch 1601. When the mode register code MRC is received by the gain code decoder 120, the code shifter 150 may change the code shift signal CSH based on a gain information code GIC corresponding to the mode register code MRC and a thermometer code TMC corresponding to the offset calibration code CALC.

As an example, when the code shifter 150 receives the third gain code GI3, the code shifter 150 may output the code shift signal CSH including the first switch signal T1D and the second switch signal T2D having a low level (or logic 0) through the first to fifth logic gates 1501 to 1505 of FIG. 9. The current switch circuit 160 may turn off two current switches, such as the first current switch 1601 and the second current switch 1602 corresponding to the first switch signal T1D and the second switch signal T2D, and then the input/output circuit 1240 may obtain an effect of shifting the offset calibration code CALC as coded down.

As another example, when the code shifter 150 receives the seventh gain code GI7, the code shifter 150 may output the code shift signal CSH including the thirteenth switch signal T13D, the fourteenth switch signal T14D and the fifteenth switch signal T15D having a high level (or logic 1) through the sixth to tenth logic gates 1506 to 1510 of FIG. 10. The current switch circuit 160 may turn on three current switches, such as the thirteenth current switch 1613, the fourteenth current switch 1614 and the fifteenth current switch 1615 corresponding to the thirteenth switch signal T13D, the fourteenth switch signal T14D, and the fifteenth switch signal T15D, respectively, and then the input/output circuit 1240 may obtain an effect of shifting the offset calibration code CALC as coded up.

Figure 13:
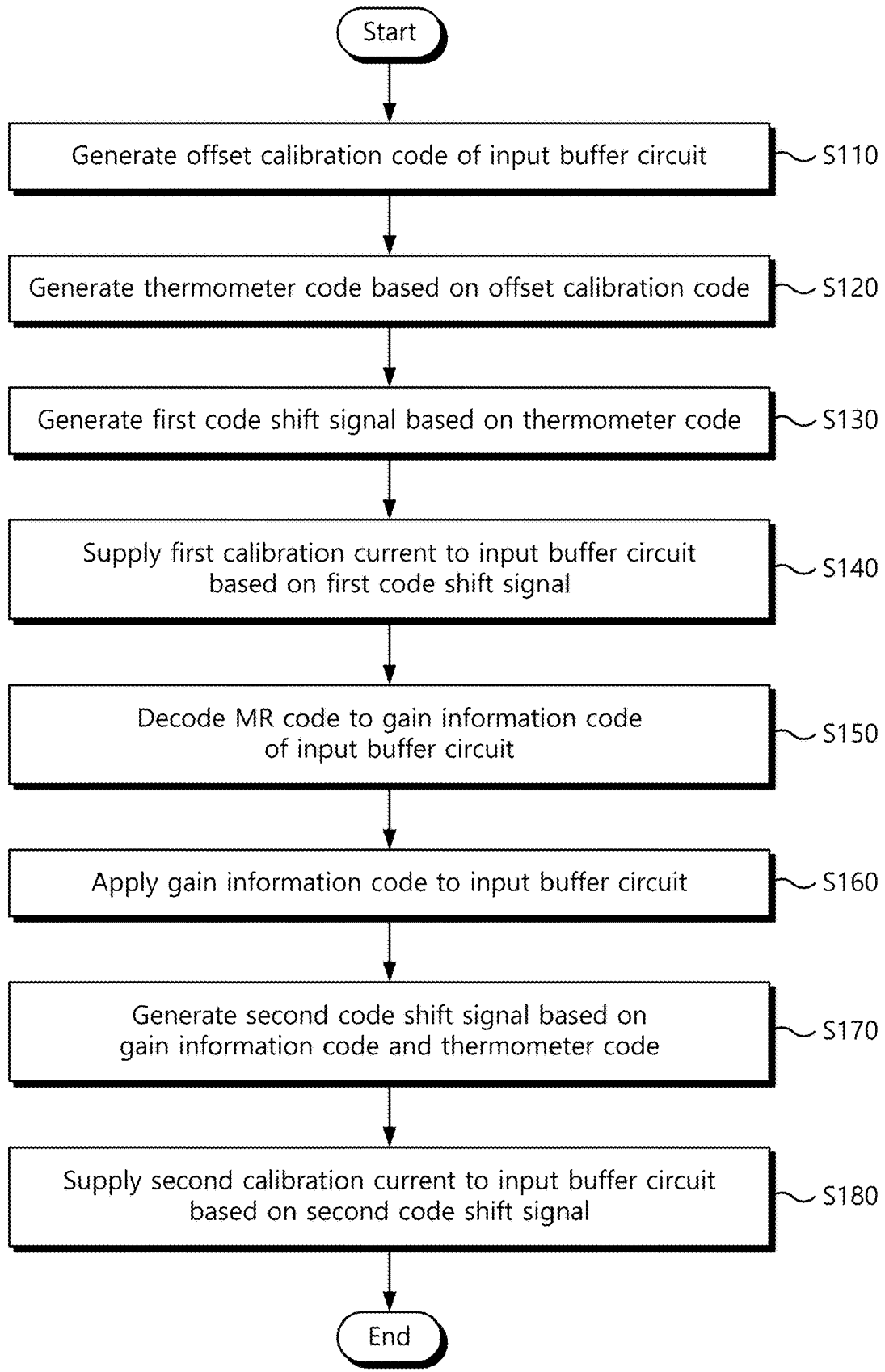
FIG. 13 is a flowchart illustrating a method of calibrating for an input offset of the input/output circuit of FIG. 5.

FIG. 13 is a flowchart illustrating a method of calibrating for an input offset of the input/output circuit of FIG. 5. Referring to FIGS. 5 to 13, before receiving a mode register code MRC for determining a gain of the input buffer circuit 110, the input/output circuit 1240 may generate an offset calibration code CALC corresponding to the input buffer circuit 110. After receiving the mode register code MRC, the input/output circuit 1240 may control a current amount of an input terminal of the input buffer circuit 110 so that the offset calibration code CALC is shifted corresponding to the mode register code MRC.

According to an example embodiment, in operation S110, the input/output circuit 1240 may generate the offset calibration code CALC of the input buffer circuit 110. For example, the input buffer circuit 110 may receive a first data D1 from the memory controller 1100 of FIG. 1 through the data pad DQ. The input buffer circuit 110 may output second data D2 by comparing the first data D1 and a reference voltage VREF. The offset calibration logic 130 may generate the offset calibration code CALC based on the second data D2. During the offset calibration operation, the offset calibration logic 130 may connect the data pad DQ and a terminal of the reference voltage VREF to an interlocking source, and then determine an input offset based on the measured second data D2. The offset calibration logic 130 may generate an offset calibration code CALC based on the input offset. The offset calibration logic 130 may generate an offset calibration code CALC before receiving the mode register code MRC. Furthermore, the offset calibration logic 130 may generate shift direction signals SIGN1 and SIGN2 corresponding to the offset calibration code CALC. The shift direction signals SIGN1 and SIGN2 may be transmitted to the current switch circuit 160 and determine the direction of the code shift.

According to an example embodiment, in operation S120, the input/output circuit 1240 may generate a thermometer code TMC based on the offset calibration code CALC. For example, the thermometer code generator 140 may convert the offset calibration code CALC into a thermometer code TMC. The offset calibration code CALC may be composed of 4-bit codes (e.g., 0000 to 1111). The thermometer code TMC may be composed of codes corresponding to the number of current switches included in the current switch circuit 160. The thermometer code TMC may be a code in which the number of "1s" is sequentially increased, and the number of "1s" included in the thermometer code TMC may correspond to the number of current switches turned on in the current switch circuit 160.

As an example, referring to FIG. 6, the thermometer code TMC may correspond to the offset calibration code CALC one-to-one. As the offset calibration code CALC increases, the number of "1s" included in the thermometer code TMC may increase by one. The number of "1s" included in the thermometer code TMC may correspond to the number of current switches turned on in the current switch circuit 160. The thermometer code generator 140 may transmit the thermometer code TMC to the code shifter 150.

According to an example embodiment, in operation S130, the input/output circuit 1240 may generate a first code shift signal based on the thermometer code TMC. For example, before receiving the mode register code MRC, the code shifter 150 may generate the first code shift signal based only on the thermometer code TMC corresponding to the offset calibration code CALC. According to an example embodiment, in operation S140, the input/output circuit 1240 may supply a first calibration current to the input buffer circuit 110 based on the first code shift signal. For example, the current switch circuit 160 may supply the first calibration current to a current element, such as the first input transistor INT1 or the second input transistor INT2 connected to either the first input terminal 111_1 or the second input terminal 111_2 of the first input buffer 111. Before receiving the mode register code MRC, the first calibration current may calibrate the first input offset of the input buffer circuit 110 according to the offset calibration code CALC.

According to an example embodiment, in operation S150, the input/output circuit 1240 may decode the mode register code MRC into a gain information code GIC of the input buffer circuit 110. For example, the gain code decoder 120 may receive the mode register code MRC from the control logic 1250 of FIG. 2. The gain code decoder 120 may convert the mode register code MRC into the gain information code GIC. As an example, referring to FIG. 4, the mode register code MRC may be composed of 3-bit codes (e.g., 011, 010, 001, 000, 101, 110, 111). The gain information code GIC may be composed of codes (e.g., a default gain code GI0, a first gain code GI1 to a third gain code GI3, a fifth gain code GI5 to a seventh gain code GI7) corresponding to specified gain values (e.g., 6 dB, 4 dB, 2 dB, 0 dB, −2 dB, −4 dB, −6 dB), respectively.

According to an example embodiment, in operation S160, the input/output circuit 1240 may apply the gain information code GIC to the input buffer circuit 110. For example, the input buffer circuit 110 may change a gain of the first input buffer 111 based on the gain information code GIC. The first input buffer 111 may be initially set to a default gain (e.g., 0 dB). As an example, the input buffer circuit 110 may include the first input buffer 111 and the second input buffer 112. The gain of the first input buffer 111 may be changed based on the gain information code GIC received from the gain code decoder 120. The first input buffer 111 may compare a first data D1 and a reference voltage VREF and generate an intermediate digital signal based on a gain according to the gain information code GIC. The second input buffer 112 may sample the intermediate digital signal based on a specified gain regardless of the gain information code GIC. The second input buffer 112 may output a second data D2 by comparing the intermediate digital signal with the reference voltage VREF.

According to another example embodiment, in operation S170, the input/output circuit 1240 may generate a second code shift signal based on the gain information code GIC or the thermometer code TMC. For example, the code shifter 150 may generate the code shift signal CSH based on the gain information code GIC and the thermometer code TMC. After receiving the mode register code MRC, the code shifter 150 may generate the second code shift signal based on the gain information code GIC corresponding to the mode register code MRC and the thermometer code TMC corresponding to the offset calibration code CALC. The code shifter 150 may convert the thermometer code TMC into pre-switch signals T1 to T15.

As an example, the code shifter 150 may include at least one logic circuit. At least one logic circuit may generate a second code shift signal modified by combining the gain information code GIC and some of the pre-switch signals T1 to T15. Based on a required amount of code shift in FIG. 4, code down logic and code up logic may be set. The required amount of code shift may be determined based on a difference between an offset calibration code CALC (e.g., 0111) of a default gain (e.g., 0 dB) and an offset calibration code CALC corresponding to each gain. Based on the code down logic and the code up logic, at least one logic circuit of the code shifter 150 may be configured.

According to an example embodiment, in operation S180, the input/output circuit 1240 may supply a second calibration current to the input buffer circuit 110 based on the second code shift signal. For example, the current switch circuit 160 may supply the second calibration current to the current element, such as the first input transistor INT1 or the second input transistor INT2, connected to either the first input terminal 111_1 or the second input terminal 111_2 of the first input buffer 111. After receiving the mode register code MRC, the second calibration current may calibrate a second input offset of the input buffer circuit 110 changed according to the mode register code MRC. The current switch circuit 160 may include at least one current source turned on or off based on at least one switch signal.

As an example, referring to FIG. 8, the current switch circuit 160 may include fifteen current sources, such as the first to fifteenth current switches 1601 to 1615. Before the mode register code MRC is received, the current switch circuit 160 may be turned on or off the current sources based on the first code shift signal corresponding to the offset calibration code CALC (e.g., 0111) of the default gain (e.g., 0 dB). After the mode register code MRC is received, the current switch circuit 160 may turn on or off some of the current sources based on the second code shift signal changed to correspond to the mode register code MRC. The changed number of turned on current sources of the current switch circuit 160 may correspond to the offset calibration code CALC changed according to the gain information included in the mode register code MRC.

Furthermore, the current switch circuit 160 may receive the shift direction signals SIGN1 and SIGN2 from the offset calibration logic 130. Based on the shift direction signals SIGN1 and SIGN2, the current switch circuit 160 may connect the turned on current sources to a current element connected to one of the input terminals of the first input buffer 111, such as the first input transistor INT1 or the second input transistor INT2. In FIG. 8, when the first shift direction signal SIGN1 has a high level and the second shift direction signal SIGN2 has a low level, the current switch circuit 160 may supply the calibration current to the first input terminal 111_1 of the first input buffer 111 related to the data pad DQ. When the first shift direction signal SIGN1 has a low level and the second shift direction signal SIGN2 has a high level, the current switch circuit 160 may supply the calibration current to the input terminal 111_2 of the second input buffer 111 related to the reference voltage VREF.

As described above, the input/output circuit 1240 of the present disclosure may generate the offset calibration code CALC for the input buffer circuit 110 before the mode register code MRC is received. The input/output circuit 1240 may generate the first code shift signal based on the offset calibration code CALC. The current switch circuit 160 may supply the first calibration current to an input terminal of the first input buffer 111 based on the first code shift signal. After the mode register code MRC is received, the input/output circuit 1240 may not regenerate the offset calibration code CALC to be changed according to the mode register code MRC, but generate the second code shift signal modified based on the offset calibration code CALC and the gain information code GIC, corresponding to the mode register code MRC, which are obtained before the mode register code MRC is received. Based on the second code shift signal, the current switch circuit 160 may apply the changed second calibration current to a current element connected to one of the input terminals of the first input buffer 111, such as the first input transistor INT1 or the second input transistor INT2. Through this, the input/output circuit 1240 may have an effect of regenerating the offset calibration code CALC corresponding to the mode register code MRC. Compared to a method of regenerating a changed offset calibration code CALC of the input buffer circuit 110 according to the mode register code MRC, a method of adjusting the current amount of the current switch circuit 160 based on the change of the code shift signal CSH according to the present disclosure may shorten an offset calibration operation time.

According to the present disclosure, after receiving a mode register code, an offset calibration code may be obtained logically (or in a matrix) based on the received mode register code without the need to obtain the offset calibration code again through an offset calibration, so that the calibration time of input offset corresponding to a changed gain of the input buffer circuit may be shortened.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:
a memory cell array;
an input/output circuit configured to generate second data in response to sampling first data by comparing the first data against a reference voltage, and further configured to:
generate an offset calibration code corresponding to a first input offset of the input/output circuit based on the second data, prior to receiving a mode register code;
change a gain of an input buffer corresponding to the mode register code after receiving the mode register code; and
calibrate a second input offset corresponding to the changed gain of the input buffer by adjusting a current amount applied to a current element electrically connected to an input terminal of the input buffer based on the offset calibration code and the mode register code; and
control logic configured to provide the mode register code, which includes gain information associated with the input/output circuit, to the input/output circuit.

2. The memory device of claim 1, wherein the input/output circuit is configured to:
convert the mode register code into a gain information code that indicates a gain of the input buffer;
convert the offset calibration code into a thermometer code that indicates a stepwise increase in the current amount; and
generate a code shift signal, which includes increase or decrease information of the current amount, by combining the gain information code and the thermometer code.

3. The memory device of claim 1, wherein the input/output circuit is configured to generate a shift direction signal for determining a current element, of which the current amount is adjusted, among current elements electrically connected to input terminals of the input buffer when the offset calibration code is generated.

4. The memory device of claim 1, wherein the input/output circuit is configured to generate the offset calibration code after connecting the data pad and the input terminal of the reference voltage to an interlocking source.

5. A memory device, comprising:
a memory cell array; and
an input/output circuit configured to generate second data, which is stored in the memory cell array, in response to comparing first data received via a data pad against a reference voltage, said input/output circuit including:
an input buffer circuit electrically connected to the data pad and configured to output the second data by comparing the first data against the reference voltage;
a current switch circuit configured to supply current to at least one input terminal of the input buffer circuit;
an offset calibration logic configured to generate an offset calibration code corresponding to a first input offset of the input buffer circuit based on the second data, before receiving a mode register code including gain information of the input buffer circuit;
a thermometer code generator configured to convert the offset calibration code into a thermometer code corresponding to the number of current sources included in the current switch circuit;
a gain code decoder configured to convert the mode register code into a gain information code corresponding to gain values used in the input buffer circuit; and
a code shifter configured to generate a code shift signal for controlling the current switch circuit by combining the gain information code or the thermometer code; and
wherein the current switch circuit is configured to adjust a current amount applied to a current element electrically connected to at least one input terminal of the input buffer based on the code shift signal such that a second input offset corresponding to the changed gain of the input buffer circuit is calibrated after the mode register code is received.

6. The memory device of claim 5, wherein the current switch circuit is configured to:
turn on a specified number of current sources based on a first code shift signal corresponding to the offset calibration code; and
turn on or off at least some of the current sources specified by a second code shift signal corresponding to the mode register code, after the mode register code is received.

7. The memory device of claim 5, wherein the offset calibration logic is configured to generate a shift direction signal for determining a current element, of which the current amount is adjusted, among current elements electrically connected to at least one input terminal of the input buffer circuit when the offset calibration code is generated.

8. The memory device of claim 5,
wherein the input buffer circuit includes:
an input buffer configured to include a first input end and a second input end;
a first input transistor configured to have a gate electrically connected to the data pad and a drain electrically connected to the first input terminal; and
a second input transistor configured to have a gate to which the reference voltage is applied, and a drain electrically connected to the second input terminal;
wherein the current switch circuit is configured to:
supply a calibration current to the first input transistor when a first shift direction signal is activated; and
supply a calibration current to the second input transistor when a second shift direction signal is activated.

9. The memory device of claim 5, wherein the code shifter is configured to generate the code shift signal to additionally turn on at least some current sources of the current switch circuit when a gain of the input buffer circuit is reduced according to the mode register code.

10. The memory device of claim 5, wherein the code shifter is configured to generate the code shift signal to additionally turn off at least some current sources of the current switch circuit when a gain of the input buffer circuit is increased according to the mode register code.

11. The memory device of claim 5, wherein the code shifter is configured to generate the code shift signal to additionally turn on at least some current sources of the current switch circuit when the offset calibration code needs to be increased by reception of the mode register code.

12. The memory device of claim 5, wherein the code shifter is configured to generate the code shift signal to additionally turn off at least some current sources of the current switch circuit when the offset calibration code needs to be reduced by reception of the mode register code.

13. The memory device of claim 5, wherein the code shift signal is configured to include switch signals corresponding one-to-one with current sources included in the current switch circuit.

14. The memory device of claim 5,
wherein the input buffer circuit includes:
a first input buffer electrically connected to the data pad and configured to have a gain changed based on the gain information code; and
a second input buffer configured to output the second data corresponding to receiving an output signal of the first input buffer, and maintain a specified gain independent of the gain information code.

15. A method of calibrating an input offset of a memory device, the method comprising:
generating an offset calibration code corresponding to a default gain of the input buffer circuit;
generating a thermometer code based on the offset calibration code;
generating a first code shift signal based on the thermometer code;
supplying a first calibration current to a current element electrically connected to an input terminal of the input buffer circuit, based on the first code shift signal;
decoding a mode register code to generate a gain information code determining a gain of the input buffer circuit when the mode register code is received;
applying the gain information code to the input buffer circuit;
generating a second code shift signal based on the gain information code and the thermometer code; and
supplying a second calibration current to the current element electrically connected to the input terminal of the input buffer circuit based on the second code shift signal.

16. The method of claim 15,
wherein the input buffer circuit is configured to compare first data received through a data pad with a reference voltage and output sampled second data;
wherein said generating an offset calibration code includes generating the offset calibration code based on the second data in a state in which the data pad and the input terminal of the reference voltage are electrically connected to an interlocking source.

17. The method of claim 15, wherein said generating an offset calibration code is performed before the mode register code is received based on the default gain of the input buffer circuit.

18. The method of claim 15, wherein the thermometer code is generated to correspond to the number of current sources included in a current switch circuit which supplies the first calibration current or the second calibration current to a current element, which is electrically connected to an input terminal of the input buffer circuit.

19. The method of claim 18, wherein said generating a second code shift signal includes generating the second code shift signal for additionally turning on at least some current sources of the current switch circuit when the gain of the input buffer circuit is reduced according to the mode register code.

20. The method of claim 18, wherein said generating a second code shift signal includes generating the second code shift signal for additionally turning off some current sources of the current switch circuit when the gain of the input buffer circuit is increased according to the mode register code.

* * * * *